(12) United States Patent
Kimishima et al.

(10) Patent No.: US 7,622,932 B2
(45) Date of Patent: Nov. 24, 2009

(54) MEASURING APPARATUS, AND DETECTION DEVICE

(75) Inventors: Masayuki Kimishima, Tokyo (JP); Shoichi Mizuno, Tokyo (JP); Takao Seki, Tokyo (JP)

(73) Assignee: Advantest Corporation, Tokyo (JP)

( * ) Notice: Subject to any disclaimer, the term of this patent is extended or adjusted under 35 U.S.C. 154(b) by 116 days.

(21) Appl. No.: 11/863,279

(22) Filed: Sep. 28, 2007

(65) Prior Publication Data

US 2009/0085581 A1 Apr. 2, 2009

(51) Int. Cl.
*G01R 27/04* (2006.01)
*G01R 27/32* (2006.01)

(52) U.S. Cl. .................... 324/638; 324/646
(58) Field of Classification Search ................ 324/637, 324/650, 638, 646
See application file for complete search history.

(56) References Cited

U.S. PATENT DOCUMENTS

| | | | |
|---|---|---|---|
| 5,003,253 A * | 3/1991 | Majidi-Ahy et al. | 324/754 |
| 6,636,816 B1 * | 10/2003 | Dvorak et al. | 702/66 |
| 7,218,186 B2 * | 5/2007 | Chen | 333/116 |

FOREIGN PATENT DOCUMENTS

| | | |
|---|---|---|
| JP | 06-232608 | 8/1994 |
| JP | 08-078917 | 3/1996 |
| JP | 08-167818 | 6/1996 |
| JP | 10-311854 | 11/1998 |
| JP | 2001-285112 | 10/2001 |
| JP | 2004-132985 | 4/2004 |

\* cited by examiner

*Primary Examiner*—Diego Gutierrez
*Assistant Examiner*—Amy He
(74) *Attorney, Agent, or Firm*—Osha • Liang LLP

(57) ABSTRACT

A measuring apparatus that measures a characteristic of a device under measurement is provided. The measuring apparatus includes: a signal generating section that outputs a forward signal to the device under measurement through a device side terminal; a directional coupler that outputs a backward split signal obtained by splitting a part of a backward signal inputted from the device under measurement through the device side terminal; a backward mixer that outputs a backward detection signal obtained by multiplying a local signal having a predetermined frequency by the backward split signal; and an analysis section that analyzes a characteristic of the device under measurement based on the backward detection signal. The directional coupler is included in a multilayer substrate, and the backward mixer is included in a chip provided on a surface of the multilayer substrate.

10 Claims, 5 Drawing Sheets

A-A'

MEASURING APPARATUS, AND DETECTION DEVICE

BACKGROUND

1. Technical Field

The present invention relates to a measuring apparatus and a detection device. Particularly, the present invention relates to a measuring apparatus that measures a characteristic of a device under measurement and a detection device that detects signals.

2. Related Art

As a measuring apparatus that measures a reflection characteristic and a transfer characteristic of each terminal of the device under measurement by measuring high frequency property such as a scattering matrix parameter (hereinafter referred to as S parameter) of a device under measurement, a network analyzer has been known as disclosed, for example, in Japanese Patent Application Publication No. 10-311854. A measurement by means of such network analyzer is often performed along with a performance test of a device under measurement such as IC and LSI. Therefore, if the network analyzer is miniaturized and built in a test apparatus that performs a performance test of the device under measurement, measuring the reflection characteristic and the transfer characteristic of each terminal of the device under measurement and performing a performance test of the device under measurement can be effectively executed. However, such as a signal measurement circuit of the network analyzer has a number of components, for example, it has been difficult to be miniaturized.

SUMMARY

Therefore, it is an object of an aspect of the innovations herein to provide a measuring apparatus and detection device, which are capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary measuring apparatus that measures characteristic of a device under measurement is provided. The measuring apparatus includes: a signal generating section that outputs a forward signal to the device under measurement through a device side terminal; a directional coupler that outputs a backward split signal obtained by splitting a part of a backward signal inputted from the device under measurement through the device side terminal; a backward mixer outputs a backward detection signal obtained by multiplying a local signal having a predetermined frequency by the backward split signal; and a analysis section that analyzes a characteristic of the device under measurement based on the backward detection signal. The directional coupler is included in a multilayer substrate. The backward mixer is included in a chip provided on a surface of the multilayer substrate.

According to a second aspect related to the innovations herein, one exemplary detection device that detects signals is provided. The detection device includes: a directional coupler that outputs a backward split signal obtained by splitting a part of a backward signal inputted through a terminal; and a backward mixer that outputs a backward detection signal obtained by multiplying a local signal having a predetermined frequency by the backward split signal. The directional coupler is included in a multilayer substrate. The backward mixer is included in a chip provided on a surface of the multilayer substrate.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on preferred embodiments, which do not intend to limit the scope of the invention, but exemplify the invention. All of the features and the combinations thereof described in the embodiments are not necessarily essential to the invention.

Figure 1:
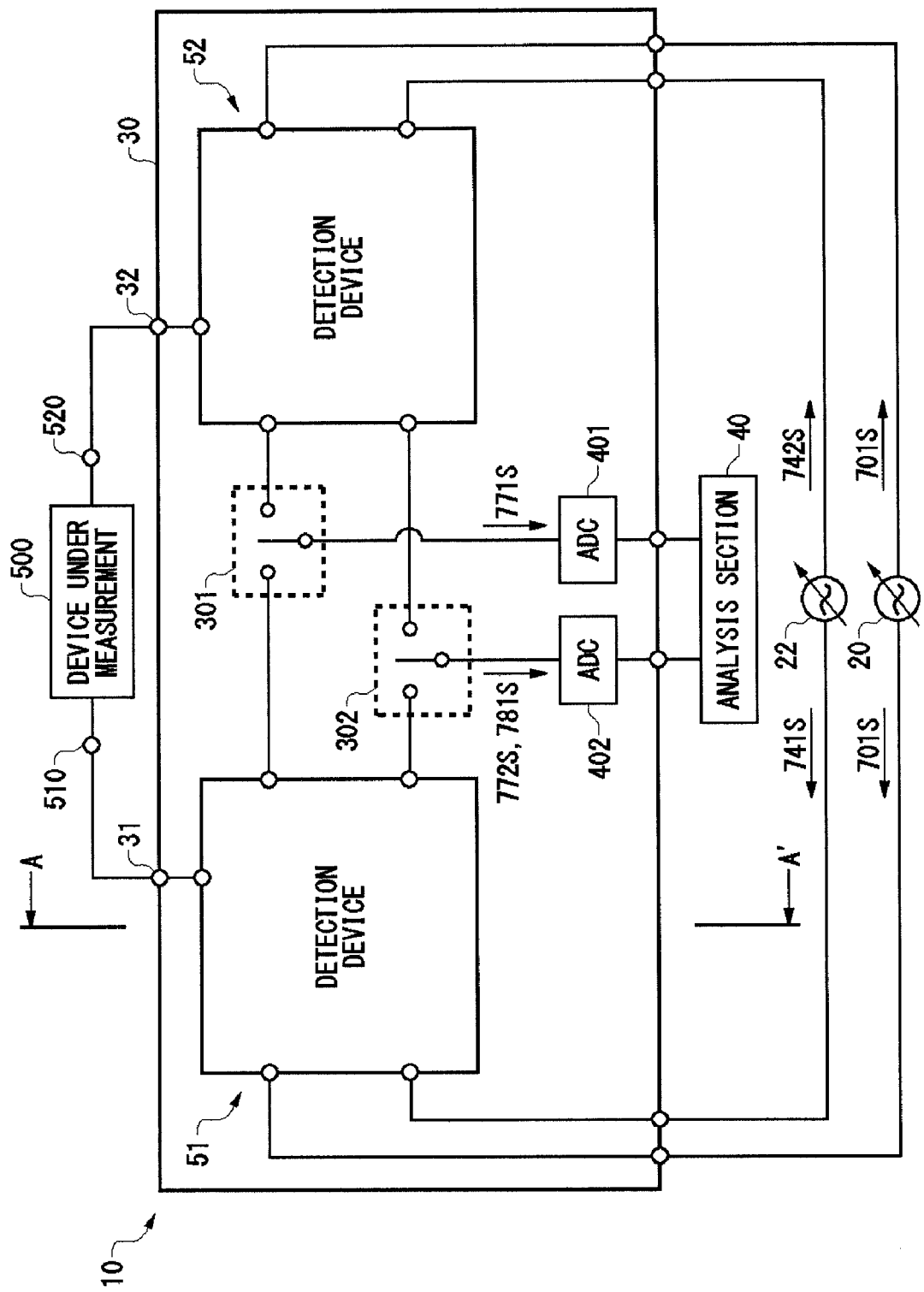
FIG. 1 shows a configuration in which a measuring apparatus 10 according to the present embodiment measures a device under measurement 500.

FIG. 1 shows a configuration in which a measuring apparatus 10 according to the present embodiment measures a device under measurement 500. The device under measurement 500 undergoing a measurement by the measuring apparatus 10 has a first port 510 and a second port 520 which are a set of input-output terminals. Here, a signal inputted to the first port 510 is outputted from the second port 520. The measuring apparatus 10 is an apparatus that measures a reflection characteristic and a transfer characteristic of the first port 510 and the second port 520 of the device under measurement 500 and includes a measuring signal generating section 20, a local signal generating section 22, a main substrate 30 and an analysis section 40. The main substrate 30 includes a detection device 51, a detection device 52, a switching section 301, a switching section 302, an A/D converting section 401 and an A/D converting section 402.

The detection device 51 is electrically connected to the measuring signal generating section 20, the local signal generating section 22, the switching section 301 and the switching section 302, respectively, and further electrically connected to the first port 510 of the device under measurement 500 through a device side terminal 31 of the main substrate 30. Meanwhile, the detection device 52 is electrically connected to the measuring signal generating section 20, the local signal generating section 22, the switching section 301 and the switching section 302, respectively and further electrically connected to the second port 520 of the device under measurement 500 through the device side terminal 32 of the main substrate 30.

Figure 2:
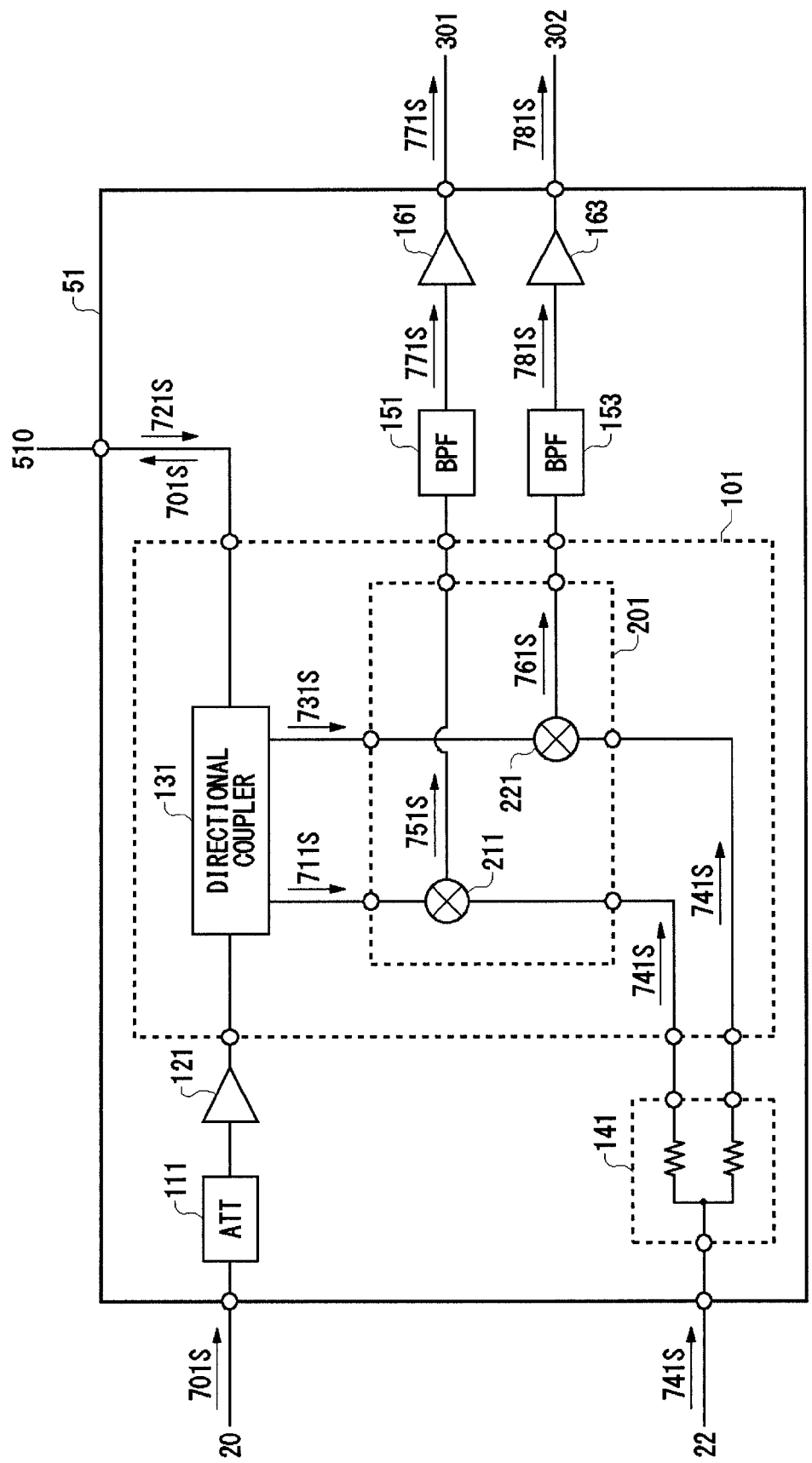
FIG. 2 shows an internal configuration of a detection device 51.

FIG. 2 shows an interior configuration of the detection device 51. The detection device 51 includes a multilayer substrate 101, an attenuator 111, an amplifier 121, a signal distributing circuit 141, a band-pass filters 151 and 153 and amplifiers 161 and 163. The multilayer substrate 101 includes a directional coupler 131 which is formed therein and a chip 201 which is formed on the surface thereof. The chip 201 includes a forward mixer 211 and a backward mixer 221. Here, the forward mixer 211 and the backward mixer 221 may be included in individual chips, respectively.

Figure 3:
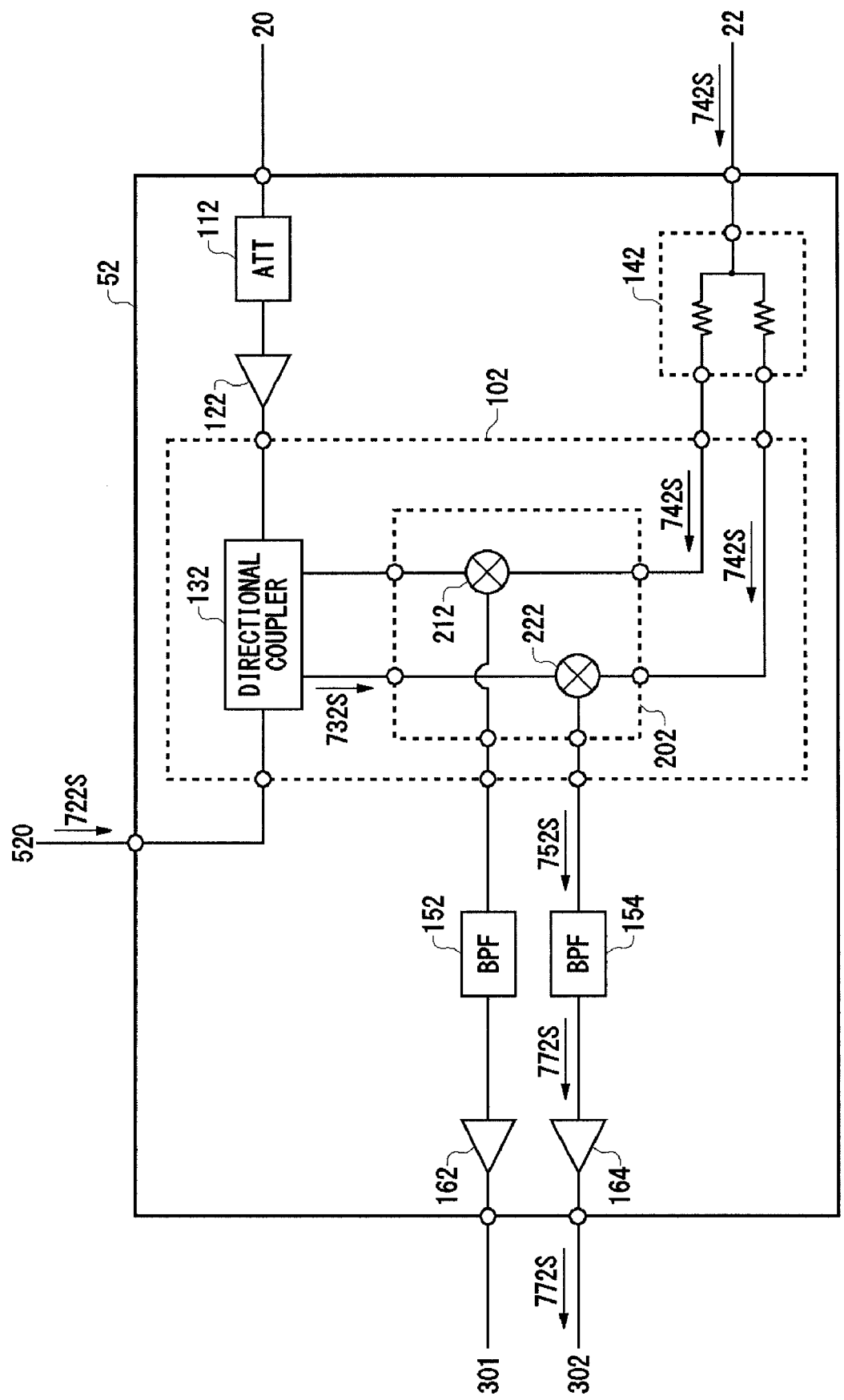
FIG. 3 shows an internal configuration of a detection device 52.

FIG. 3 shows an interior configuration of the detection device 52. The detection device 52 includes a multilayer substrate 102, an attenuator 112, an amplifier 122, a signal distributing circuit 142, band-pass filters 152 and 154, and amplifiers 162 and 164. The multilayer substrate 102 includes a directional coupler 132 which is formed therein and a chip 202 which is formed on the surface thereof. The chip 202 includes a forward mixer 212 and a backward mixer 222.

Hereinafter, measuring a reflection characteristic of the first port 510 of the device under measurement 500 will be described. In the measurement, an output side of the amplifier 161 of the measuring apparatus 10 is electrically connected to an input side of the A/D converting section 401 by the switching section 301. Meanwhile, an output side of the amplifier 163 is electrically connected to an input side of the A/D converting section 402 by the switching section 302. The measuring signal generating section 20 outputs a forward signal 701S to the attenuator 111 of the detection device 51. The forward signal 701S may be a high frequency signal having a predetermined frequency within a frequency band appropriate for measuring the reflection characteristic, for example. The attenuator 111 attenuates the forward signal 701S at a certain attenuation factor and outputs it to the amplifier 121, for example. Here, the attenuator 111 may not attenuate the forward signal 701S but directly output it to the amplifier 121, for example.

The amplifier 121 amplifies the forward signal 701S at a certain amplification factor and outputs it to the directional coupler 131, for example. The directional coupler 131 outputs the forward signal 701S to the device side terminal 31 and outputs a forward split signal 711S obtained by splitting a part of the forward signal 701S to the forward mixer 211 of the chip 201. The forward signal 701S outputted from the directional coupler 131 to the device side terminal 31 is applied to the first port 510 of the device under measurement 500 through the device side terminal 31.

Here, the multilayer substrate 101 inputs to the directional coupler 131 through the device side terminal 31 a backward signal 721S which is outputted from the first port 510 by applying the forward signal 701 to the first port 510 of the device under measurement 500. The directional coupler 131 outputs a backward split signal 731 obtained by splitting a part of the backward signal 721S to the backward mixer 221 of the chip 201. Here, for the directional coupler 131, a ratio of the forward split signal 711S obtained by splitting from the forward signal 701S to the forward signal 701S (intensity ratio) and a ratio of the backward split signal 731S obtained by splitting from the backward signal 721S to the backward signal 721S (intensity ratio) are dependent on the characteristic of the directional coupler 131 and known by previously measuring, for example.

The local signal generating section 22 outputs a local signal 741S to the signal distributing circuit 141 of the detection device 51. Here, it is preferred that the frequency of the local signal 741S can be sampled by the A/D converting section 401 and the A/D converting section 402. The signal distributing circuit 141 splits the local signal 741S into two and outputs one of the split signals to the forward mixer 211 of the chip 201 and the other of the split signals to the backward mixer 221 of the chip 201, respectively.

The forward mixer 211 outputs to the band-pass filter 151 a forward detection signal 751S obtained by multiplying the one of the local signal 741S split by the signal distributing circuit 141 by the forward split signal 711S from the directional coupler 131. The band-pass filter 151 transmits a signal component of a frequency band of the forward detection signal 751S which is to be detected (hereinafter referred to as a forward transmission signal 771S). Here, the forward transmission signal 771S may be a signal component of the frequency band around the frequency which is the difference between the frequency of the local signal 741S and that of the forward split signal 711S, for example.

Meanwhile, the backward mixer 221 outputs to the band-pass filter 153 a backward detection signal 761S obtained by multiplying the other of the local signal 741S split by the signal distributing circuit 141 by the backward split signal 731S from the directional coupler 131. The band-pass filter 153 transmits therethrough a signal component of a frequency band of the backward detection signal 761S which is to be detected (hereinafter referred to as a backward transmission signal 781S). Here, the backward transmission signal 781S may be a signal component of the frequency band around the frequency which is the difference between the frequency of the local signal 741S and that of the backward split signal 731S, for example.

The amplifier 161 amplifies the forward transmission signal 771S transmitted through the band-pass filter 151 at a certain amplification factor and outputs it, for example. The forward transmission signal 771S from the amplifier 161 is inputted to the A/D converting section 401. Meanwhile, the amplifier 163 amplifies the backward transmission signal 781S transmitted through the band-pass filter 153 at a certain amplification factor and outputs it, for example. The backward transmission signal 781S from the amplifier 163 is inputted to the A/D converting section 402.

The A/D converting section 401 A/D converts the forward transmission signal 771S from the amplifier 161 and outputs it to the analysis section 40. Meanwhile, the A/D converting section 402 A/D converts the component of the backward transmission signal 781S from the amplifier 163 and outputs it to the analysis section 40. The analysis section 40 calculates a voltage level of the forward signal 701S based on the forward transmission signal 771S from the A/D converting section 401 and calculates a voltage level of the backward signal 721S based on the backward transmission signal 781S from the A/D converting section 402. The analysis section 40 further analyzes the reflection characteristic of the first port 510 of the device under measurement 500 based on the calculated voltage level of the forward signal 701S and that of the backward signal 721S. At this time, the analysis section 40 may calculate a reflection coefficient (S11 of S parameter) of the first port 510 based on the analyzed reflection characteristic and display it on such as a display section, or may output the reflection coefficient to the outside.

Next, measurement of a transfer characteristic of the device under measurement 500 from the first port 510 to the second port 520 will be described. Hereinafter, contents overlapped with the measurement of the reflection characteristic of the first port 510 previously described are appropriately omitted. Moreover, signals the same as the signals provided for measuring the reflection characteristic of the first port 510 have reference numerals the same as those of the signals provided for measuring the reflection characteristic of the first port 510 and the description is omitted. In the measurement, an output side of the amplifier 161 of the measuring apparatus 10 is electrically connected to an input side of the A/D converting section 401 by the switching section 301.

Meanwhile, an output side of the amplifier 164 is electrically connected to an input side of the A/D converting section 402 by the switching section 302.

The forward signal 701S is inputted from the measuring signal generating section 20 to the detection device 51 as well as the above described measurement of the reflection characteristic of the first port 510, and the local signal 741S is inputted from the local signal generating section 22 to the detection device 51. In addition, the detection device 51 applies the forward signal 701S from the measuring signal generating section 20 to the first port 510 of the device under measurement 500. Moreover, the detection device 51 outputs a forward transmission signal 771S obtained by multiplying the local signal 741S from the local signal generating section 22 by the forward split signal 711S to the A/D converting section 401.

Among the forward signal 701S applied to the first port 510 of the device under measurement 500, a remaining portion other than a part reflected by the first port 510 (hereinafter referred to as a transfer signal 722S) is transferred to the second port 520 of the device under measurement 500. Then, the transfer signal 722S is inputted from the second port 520 to the directional coupler 132 of the detection device 52 through the device side terminal 32. The directional coupler 132 outputs a transfer split signal 732S obtained by splitting a part of the transfer signal 722S to the backward mixer 222 of the chip 202. Here, for the directional coupler 132, a ratio of the transfer split signal 732S obtained by splitting from the transfer signal 722S to the transfer signal 722S (intensity ratio) is dependent on the characteristic of the directional coupler 132 and known by previously measuring, for example.

The local signal generating section 22 outputs the local signal 741S to the signal distributing circuit 141 of the detection device 51 and also outputs a local signal 742S to the signal distributing circuit 142 of the detection device 52. Here, it is preferred that the frequency of the local signal 742S can be sampled by the A/D converting section 401 and the A/D converting section 402 as well as the local signal 741S. The signal distributing circuit 142 splits the local signal 742S into two and outputs one of the split local signals to of the backward mixer 222 of the chip 202. The backward mixer 222 outputs a transfer detection signal 752S obtained by multiplying the one of the local signals 742S split by the signal distributing circuit 142 by the transfer split signal 732S from the directional coupler 132 to the band-pass filter 154.

The band-pass filter 154 transmits a signal component of the transfer detection signal 752S within a frequency band to be detected (hereinafter referred to as a transfer transmission signal 772S). Here, the transfer transmission signal 772S may be a signal component of a frequency band around a frequency which is the difference between the frequency of the local signal 742S and that of the transfer split signal 732S, for example. The amplifier 164 amplifies the transfer transmission signal 772S transmitted through the band-pass filter 154 at a certain amplification factor and outputs it, for example. The transfer transmission signal 772S from the amplifier 164 is inputted to the A/D converting section 402.

The A/D converting section 401 A/D converts the forward transmission signal 771S from the amplifier 161 of the detection device 51 and outputs it to the analysis section 40. Meanwhile, the A/D converting section 402 A/D converts the transfer transmission signal 772S from the amplifier 164 and outputs it to the analysis section 40. The analysis section 40 calculates a voltage level of the forward signal 701S based on the forward transmission signal 771S from the A/D converting section 401 and calculates a voltage level of the transfer signal 722S based on the transfer transmission signal 772S from the A/D converting section 402. The analysis section 40 further analyzes the transfer characteristic from the first port 510 to the second port 520 of the device under measurement 500 based on the calculated voltage level of the forward signal 701S and that of the transfer signal 722S. At this time, the analysis section 40 may calculate a transfer factor (S21 of S parameter) from the first port 510 to the second port 520 based on the analyzed transfer characteristic and display it on such as a display section, and may output the transfer factor to the outside.

Here, the measuring apparatus 10 can analyze the reflection characteristic of the second port 520 by performing a measurement similar to the measurement of the reflection characteristic of the first port 510 described above by using the detection device 52 electrically connected to the second port 520. In addition, the measuring apparatus 10 may calculate a reflection factor (S22 of S parameter) from the second port 520 based on the analyzed reflection characteristic and display it on such as a display section, and may output the reflection factor to the outside.

Moreover, the measuring apparatus 10 can also analyze the transfer characteristic from the second port 520 to the first port 510 by measurement the same as the above-described measurement of the transfer characteristic from the first port 510 to the second port 520 by interchanging and performing input-output of each signal from the detection device 51 and the detection device 52. Moreover, the measuring apparatus 10 may calculate a transfer factor (S12 of S parameter) from the second port 520 to the first port 510 based on the analyzed transfer characteristic and display it on such as a display section, and may output the transfer factor to the outside.

Figure 4:
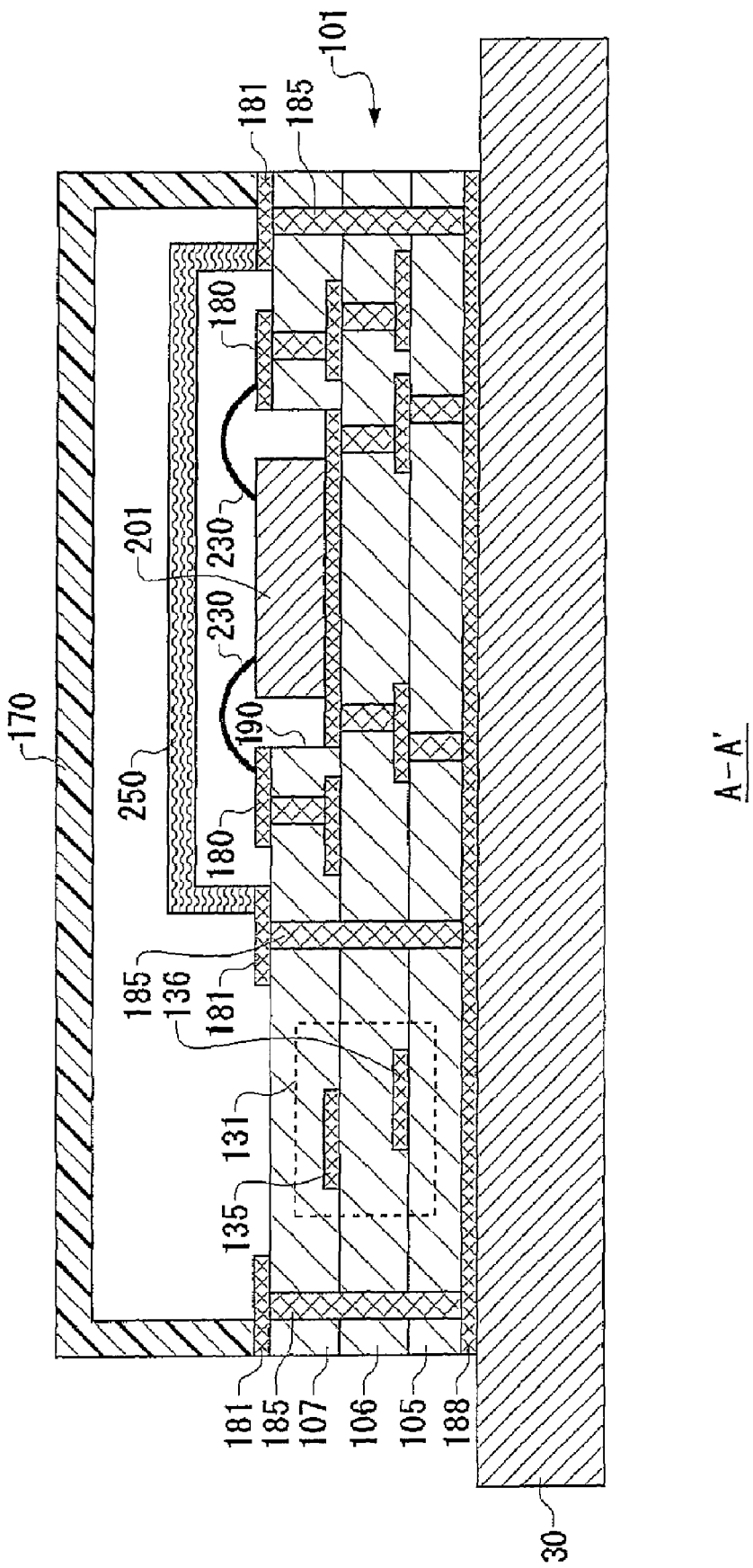
FIG. 4 shows a sectional view by A-A' line of FIG. 1 viewed from a direction indicated by an arrow.

FIG. 4 shows a sectional view by A-A' line of FIG. 1 viewed from a direction indicated by an arrow. As shown in FIG. 4, the multilayer substrate 101 includes a plurality of dielectric substrates 105, 106 and 107 laminated on each other and is provided on the upper surface of the main substrate 30. The multilayer substrate 101 may be such as a low temperature co-fired ceramics (LTCC) substrate, or the other kind of ceramic multilayer substrate. In addition, the multilayer substrate 101 may be electrically connected to a circuit formed on the upper surface of the main substrate 30 through a plurality of pads for input-output provided on the bottom surface, for example.

A concave portion 190 is formed on the surface side of the multilayer substrate 101. The chip 201 is mounted on the bottom of the concave portion 190. In addition, the chip 201 is electrically connected to a pattern wiring 180 formed on a dielectric substrate 107 by a bonding wire 230. Here, the chip 201 and the pattern wiring 180 may be electrically connected not only through the bonding wire 230, i.e. a wire bonding but also through the pattern wiring 180.

A lid portion 250 is provided on the upper side of the concave portion 190 in order to cover the concave portion 190. The lid portion 250 is made of such as a conductive material and electrically connected to the pattern wiring 181 formed around the concave portion 190 on the dielectric substrate 107. The pattern wiring 181 is electrically connected to a ground pattern 188 formed on the bottom surface of the multilayer substrate 101 through a plurality of vias 185 provided around the concave portion 190. Thereby the lid portion 250 is electrically connected to the ground pattern 188 so as to have ground potential.

As described above, the upper side of the concave portion 190 on which the chip 201 is provided is covered with the lid portion 250 electrically connected to the ground pattern 188, so that it is possible to prevent the circuit within the chip 201 from being affected by electric disturbance such as electromagnetic noise from the upper side of the multilayer substrate 101. Here, it is preferred that the configuration of the ground pattern 188 includes at least the bottom of the chip 201. Thereby it is possible to prevent the circuit within the chip 201 from being affected by electric disturbance such as electromagnetic noise from the under side of the multilayer substrate 101.

A covering section 170 is provided on the upper side of the multilayer substrate 101 in order to cover the surface of the multilayer substrate 101. It is preferred that the covering section 170 is made of such as resin and air-tightly seals the surface of the multilayer substrate 101. Moreover, in this case, it is preferred that the inside of the covering section 170 is filled with inert gas such as nitrogen gas. Thereby it is possible to prevent oxygen or moisture from invading the surface of the multilayer substrate 101 from the outside, so that it is possible to prevent components and wiring on the surface of the multilayer substrate 101 from corroding.

Here, it is preferred that the covering section 170 has physical strength enough to absorb external impacts. In addition, the surface of the multilayer substrate 101 may be protected by filling over the upper side of the multilayer substrate 101 with an insulating resin instead of the covering section 170.

In addition, the directional coupler 131 includes two strip lines 135 and 136 which are disposed on layers different from each other of the multilayer substrate 101. Specifically, the strip line 135 is patterned on the dielectric substrate 106 and the strip line 136 is patterned on the dielectric substrate 105. Here, the strip line 135 and the strip line 136 may be formed on the other layers different from each other of the multilayer substrate 101, and may be formed with a space therebetween on the same plane of the same layer. In both of the cases, it is preferred that the strip line 135 and the strip line 136 are insulated from each other.

Figure 5:
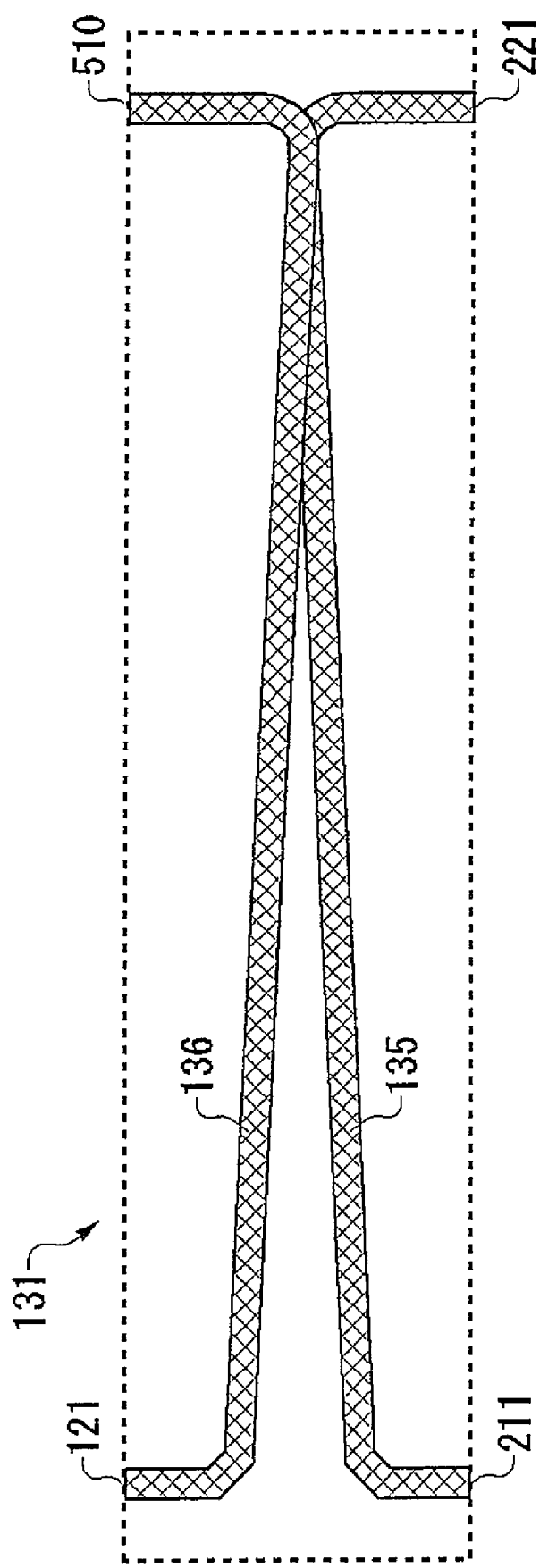
FIG. 5 shows a positional relationship between strip lines 135 and 136 viewed from the upper surface side of a multilayer substrate 101.

FIG. 5 shows a positional relationship between the strip lines 135 and 136 viewed from the upper side of the multilayer substrate 101. As shown in FIG. 5, the two strip lines 135 and 136 of the directional coupler 131 have portions opposite to each other in the thickness direction of the multilayer substrate 101. In addition, the entire strip lines 135 and 136 including the opposed portions are insulated from each other. In the directional coupler 131 having the above described structure, when a signal is transmitted from the amplifier 121 side to the first port 510 side on the strip line 136, an intensity correlation signal of said signal is generated on the strip line 135 due to electromagnetic coupling, for example. Thereby the directional coupler 131 can take the intensity correlation signal into the forward mixer 211 side. Further, when a signal is transmitted from the first port 510 side to the amplifier 121 side on the strip line 136 in the directional coupler 131, an intensity correlation signal of said signal is also generated on the strip line 135, for example. In this case, the directional coupler 131 can take the intensity correlation signal into the backward mixer 221 side.

Hereinbefore, the configuration of the cross-sectional portion including the multilayer substrate 101 of the detection device 51 in the measuring apparatus 10 has been described. Here, the configuration of the cross-sectional portion including the multilayer substrate 102 of the detection device 52 is the same as that of the detection device 51, so that the description is omitted, here, the cross-sectional portion of the detection device 52 has the characteristic the same as that of the detection device 51.

While the aspects of the invention been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As apparent from the above descriptions, according to an embodiment of the present invention, it is possible to provide the measuring apparatus 10 and the detection devices 51 and 52 which can prevent the electric circuit from being affected by electric disturbance and physical impact such as electromagnetic noise and calculate S parameter between the first port 510 and the second port 520 of the device under measurement 500.

What is claimed is:

1. A measuring apparatus that measures a characteristic of a device under measurement, comprising:
   a measuring signal generating section that outputs a forward signal to the device under measurement through a device side terminal;
   a directional coupler that outputs a backward split signal obtained by splitting a part of a backward signal inputted from the device under measurement through the device side terminal;
   a backward mixer that outputs a backward detection signal obtained by multiplying a local signal having a predetermined frequency by the backward split signal; and
   an analysis section that analyzes a characteristic of the device under measurement based on the backward detection signal,
   wherein
   the directional coupler is included in a multilayer substrate,
   the backward mixer is included in a chip provided on a surface of the multilayer substrate,
   a concave portion is formed on a surface of the multilayer substrate,
   the chip is disposed on a bottom surface of the concave portion,
   the measuring apparatus further comprises a conductive lid portion that covers the concave portion,
   the multilayer substrate further includes a ground pattern formed under the chip, and
   the ground pattern and the conductive lid portion are electrically connected so as to surround the chip.

2. The measuring apparatus as set forth in claim 1, wherein the directional coupler further outputs a forward split signal obtained by splitting a part of the forward signal,
   the measuring apparatus further includes a forward mixer that outputs a forward detection signal obtained by multiplying the local signal by the forward split signal,
   the analysis section analyzes the characteristic of the device under measurement based on at least one of the backward detection signal and the forward detection signal, and
   the forward mixer is included in the chip.

3. The measuring apparatus as set forth in claim 2 comprising the directional coupler, the backward mixer and the forward mixer corresponding to each of a first port and a second port of the device under measurement.

4. The measuring apparatus as set forth in claim 3, wherein the analysis section calculates S parameter between the first port and the second port of the device under measurement based on the forward split signal and the backward split signal outputted from the backward mixer and the forward mixer corresponding to each of the first port and the second port.

5. The measuring apparatus as set forth in claim 1, wherein the directional coupler includes at least two strip lines including portions opposed to each other, which are disposed on layers different from each other of the multilayer substrate and opposed to each other.

6. The measuring apparatus as set forth in claim 1, wherein the multilayer substrate further includes a plurality of vias provided around the concave portion that electrically connect between the ground pattern and the lid portion.

7. The measuring apparatus as set forth in claim 1, further comprising a covering section that covers the surface of the multilayer substrate.

8. The measuring apparatus as set forth in claim 1, further comprising a main substrate having an upper surface on which the multilayer substrate is disposed.

9. A detection device that detects a signal, comprising:
a directional coupler that outputs a backward split signal obtained by splitting a part of a backward signal inputted through a terminal; and
a backward mixer that outputs a backward detection signal obtained by multiplying a local signal having a predetermined frequency by the backward split signal,
wherein
the directional coupler is included in a multilayer substrate,
the backward mixer is included in a chip provided on a surface of the multilayer substrate,
a concave portion is formed on a surface of the multilayer substrate, and
the chip is disposed on a bottom surface of the concave portion,
the detection device further comprises a conductive lid portion that covers the concave portion,
the multilayer substrate further includes a ground pattern formed under the chip, and
the ground pattern and the conductive lid portion are electrically connected so as to surround the chip.

10. The detection device as set forth in claim 9, wherein the directional coupler further outputs a forward split signal obtained by splitting a part of the forward signal outputted through the terminal,
the detection device further includes a forward mixer that outputs a forward detection signal obtained by multiplying the local signal by the forward split signal, and
the forward mixer is included in the chip.

* * * * *